United States Patent [19]
Park et al.

[11] Patent Number: 5,788,825
[45] Date of Patent: Aug. 4, 1998

[54] VACUUM PUMPING SYSTEM FOR A SPUTTERING DEVICE

[75] Inventors: Jeong-Ho Park; Kwan-Ki Seo, both of Suwon, Rep. of Korea

[73] Assignee: Samsung Electronics Co., Ltd., Suwon, Rep. of Korea

[21] Appl. No.: 774,401

[22] Filed: Dec. 30, 1996

[51] Int. Cl.$^6$ .................................................. C23C 14/34
[52] U.S. Cl. ........................... 204/298.07; 204/298.25; 204/298.33
[58] Field of Search .............. 204/192.12, 298.07, 204/298.25, 298.33

[56] References Cited

U.S. PATENT DOCUMENTS

| | | | |
|---|---|---|---|
| 4,865,713 | 9/1989 | Kohlhase et al. | 204/298.07 |
| 4,892,615 | 1/1990 | Motta | 204/298.07 X |
| 4,961,832 | 10/1990 | Shagun et al. | 204/298.07 |
| 5,365,772 | 11/1994 | Ueda et al. | 204/298.07 X |
| 5,413,684 | 5/1995 | Bergman | 204/298.07 X |

*Primary Examiner*—Nam Nguyen
*Attorney, Agent, or Firm*—Jones & Volentine, L.L.P.

[57] ABSTRACT

In a vacuum pumping system, respective pumping assemblies for the reaction chamber and for the load lock chamber are separated from each other, and thereby the degree of vacuum in the reaction chamber is prevented from being degraded. The vacuum pumping system has a cryo pump for pumping the reaction chamber to have a first high degree of vacuum. A first pumping assembly pumps the load lock chamber to have a high degree of vacuum, and a second pumping assembly prevents the first high degree of vacuum from being degraded by pumping the reaction chamber. The second pumping assembly is separated from the cryo pump and the first pumping assembly so as to prevent the reaction chamber and the load lock chamber from being incorporated into one chamber when a wafer passes into and out of the reaction chamber.

4 Claims, 2 Drawing Sheets

VACUUM PUMPING SYSTEM FOR A SPUTTERING DEVICE

BACKGROUND OF THE INVENTION

1. Field of the Invention

The present invention relates to a vacuum pumping system, and more particularly, to a vacuum pumping system for a sputtering device used in a semiconductor manufacturing system, by which the degree of vacuum in the sputtering device can be elevated.

2. Description of the Related Art

A sputtering device is an apparatus used in manufacturing semiconductor devices. The sputtering device forms electrodes and wires on a semiconductor wafer by depositing a thin metal film such as aluminum or titanium on the semiconductor wafer.

In the sputtering process, high voltage is applied between an anode and a cathode in a container containing inert gas to form a strong electric field therein. Then, atoms of the target material such as aluminum are sputtered out and deposited onto the wafer to form a thin film thereon.

In such a process, the pressure in the reaction chamber must be maintained at a low vacuum pressure of $5 \times 10^{-7}$ Torr, in other words, a high degree of vacuum.

FIG. 1 schematically shows a vacuum pumping system for a conventional sputtering device (Model No. 3180, manufactured by Varian Company in the USA).

Referring to FIG. 1, in the conventional vacuum pumping system, the degree of vacuum in reaction chamber 1 and load lock chamber 2 are controlled by the same single cryo pump 3 and the same single mechanical pump 4 through a plurality of valves disposed in a plurality of vacuum lines.

In operation, reaction chamber 1 is pumped-down or evacuated to a low degree of vacuum through a differential pump out valve V7 by the mechanical pump 4, and then is pumped to a high degree of vacuum, which is suitable for the sputtering, through a high vacuum valve V1 by the cryo pump 3.

In the meantime, the load lock chamber 2, which arranges and controls the preliminary environment for the wafer loaded into and out of the reaction chamber 1, is pumped-down or evacuated to a low degree of vacuum, not higher than 100 mm Torr, by the mechanical pump 4. In this case, a load lock isolation valve V2 and a load lock evacuation valve V3 are opened.

Thereafter, in order to maintain a high degree of vacuum in the load lock chamber 2, the cryo pump 3 pumps the load lock chamber 2 while the load lock evacuation valve V3 is closed and the load lock isolation valve V2 and a load lock high vacuum valve V4 are opened.

However, when the process is carried out according to the above described load lock method, the wafer necessarily passes through the load lock chamber 2 in order to be loaded into and out of the reaction chamber 1, and thereby the degree of vacuum in the load lock chamber 2 is degraded as the process proceeds.

The cause of the degradation and the accompanying problems are described as follows. First, because the high degrees of vacuum in the reaction chamber 1 and the load lock chamber 2 are arranged and maintained by the same cryo pump 3, an appreciable amount of air molecules in the load lock chamber 2 flow back into the reaction chamber 1 as shown by an arrow P1 in FIG. 1 when the load lock high vacuum valve V4 is opened. This means there is a leakage of the vacuum in the reaction chamber 1, which prevents a thin film of good quality from being formed on the wafer.

Second, when the reaction chamber 1 and the load lock chamber 2 are evacuated to a low vacuum degree by the mechanical pump 4, a part of the pumped air flows back in a direction as shown by an arrow P2 in FIG. 1 through the differential pump out valve V7 and a load lock differential pump out valve V8, so as to generate leakage of the evacuated vacuum. This happens because the reaction chamber 1 and the load lock chamber 2 momentarily become a single chamber when a carrier plate (not shown) rotates in the reaction chamber 1 whenever the wafer comes into and out of the reaction chamber 1. Also in this case, the degree of vacuum in the reaction chamber 1 is degraded and it thus becomes difficult to form a good quality thin film on the wafer.

SUMMARY OF THE INVENTION

The present invention has been made to overcome one or more of the above described problems of the conventional art, and accordingly it is an object of the present invention to provide a vacuum pumping system in which the respective pumping assemblies for the reaction chamber and the load lock chamber are separated from each other, and thereby the degree of vacuum in the reaction chamber is prevented from being degraded.

To achieve these and other objects, the present invention provides a vacuum pumping system for a sputtering device, the sputtering device having a reaction chamber and a load lock chamber, said vacuum pumping system comprising: a dry pump for evacuating the reaction chamber and the load lock chamber to a low degree of vacuum; a cryo pump for pumping the reaction chamber to have a first high degree of vacuum; a first pumping assembly for pumping the load lock chamber to have a second high degree of vacuum, the first pumping assembly being separated from the cryo pump; a second pumping assembly for pumping the reaction chamber to maintain the first high degree of vacuum, the second pumping assembly being separated from the cryo pump and the first pumping assembly so as to prevent the reaction chamber and the load lock chamber from being incorporated into one chamber when a wafer passes into and out of the reaction chamber, the second pumping assembly preventing the first high degree of vacuum from being degraded by pumping the reaction chamber; and a plurality of valves for respectively opening and closing a plurality of vacuum lines interconnected to the reaction chamber and the load lock chamber according to operations of the dry pump, the cryo pump, and the first and the second pumping assemblies.

BRIEF DESCRIPTION OF THE DRAWINGS

The above objects, and other features and advantages of the present invention will become more apparent by describing in detail preferred embodiments thereof with reference to the attached drawings, in which.

DETAILED DESCRIPTION OF PREFERRED EMBODIMENTS

Hereinafter, a preferred embodiment of the present invention will be described in detail with reference to the accompanying drawings.

Figure 1:
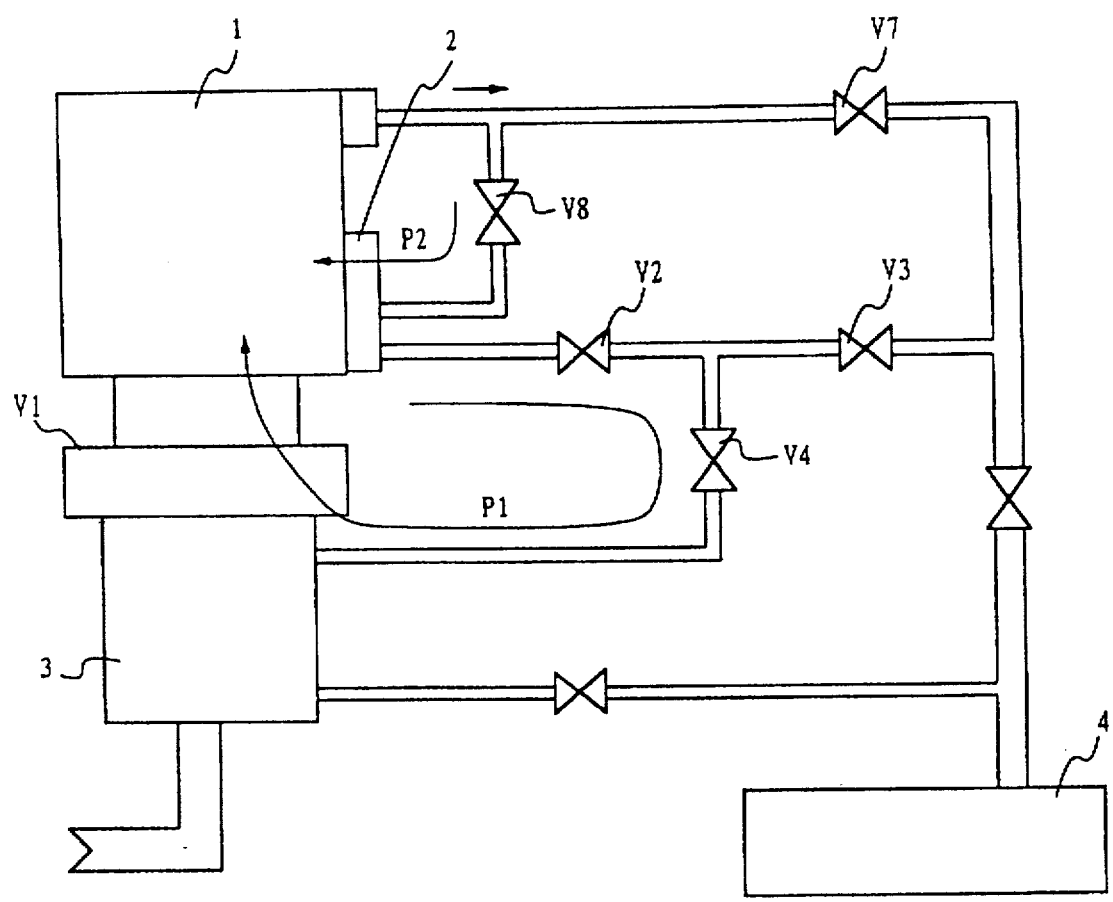
FIG. 1 is a hydraulic circuit diagram of a conventional vacuum pumping system.
Figure 2:
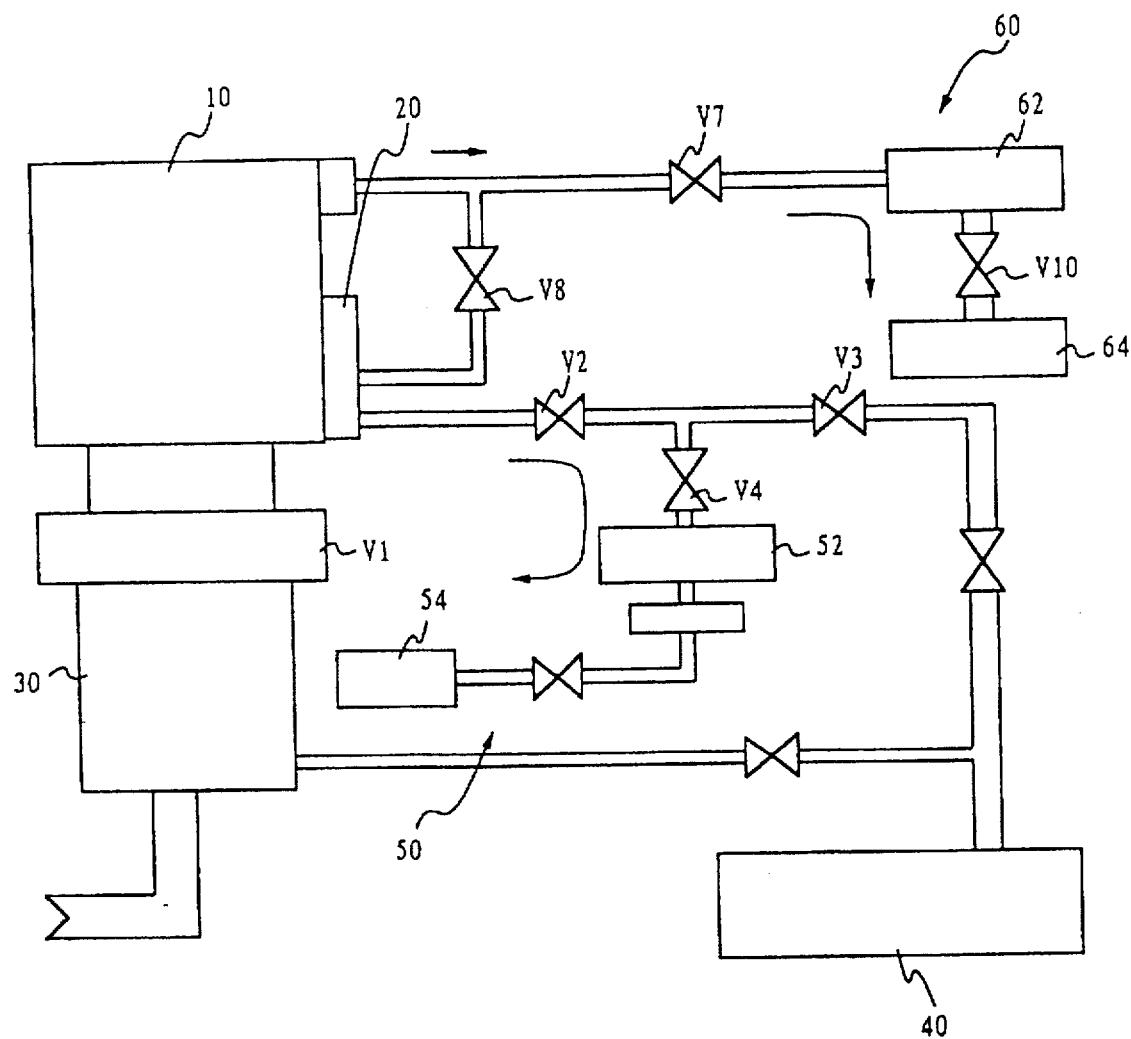
FIG. 2 is a hydraulic circuit diagram of a vacuum pumping system according to an embodiment of the present invention.

Referring to FIG. 2, there is shown the construction of a vacuum pumping system according to an embodiment of the present invention. In this embodiment, the respective degrees of vacuum in a reaction chamber 10 and a load lock chamber 20 are controlled by separate, different pumping means having a plurality of valves.

In other words, the reaction chamber 10 is pumped to have a high degree of vacuum, that is, a low vacuum pressure of about $5\times10^{-7}$ Torr, through a high vacuum valve V1 by the cryo pump 30.

On the other hand, the load lock chamber 20 is pumped to have a high degree of vacuum by a first pumping assembly 50 disposed in a separate vacuum line, where a load lock evacuation valve V3 is closed and a load lock isolation valve V2 and a load lock high vacuum valve V4 are opened. The first pumping assembly 50 includes a first turbo pump 52 and a first mechanical pump 54.

Initially, the load lock chamber 20 is evacuated to a low degree of vacuum, about $10^{-3}$ Torr, by a dry pump 40, with the load lock high vacuum valve V4 being closed while the load lock isolation valve V2 and the load lock evacuation valve V3 are opened.

Further, a separate second pumping assembly 60, along with a differential pump out valve V7 and a load lock differential pump out valve V8, is disposed in the differential line of the reaction chamber 10. The second pumping assembly 60 includes a second turbo pump 62 and a second mechanical pump 64.

In the pumping system of the present invention as described above, since the assembly for the reaction chamber 10 and the pumping assembly for the load lock chamber 20 are completely separated from each other, air molecules are prevented from flowing back into the reaction chamber 10 through the cryo pump 30 as is in the conventional pumping assembly.

Further, due to the separation between the differential line and the evacuation line, in the course of the operation of the second pumping assembly 60, the reaction chamber 10 and the load lock chamber 20 are separately maintained from each other, rather than being incorporated into one chamber, and thereby vacuum leakage is prevented even when the wafer passes into or out of the reaction chamber 10, Therefore, the pumping system of the present invention maintains the high degree of vacuum necessary for the sputtering process, resulting in an increased yield of the semiconductor devices.

While the present invention has been particularly shown and described with reference to the particular embodiments thereof, it will be understood by those skilled in the art that various changes in form and details may be effected therein without departing from the spirit and scope of the invention as defined by the appended claims and their equivalents.

What is claimed is:

1. A vacuum pumping system for a sputtering device, said sputtering device having a reaction chamber and a load lock chamber, said vacuum pumping system comprising:

a first means for evacuating said reaction chamber and said load lock chamber to a low degree of vacuum;

a second means for pumping said reaction chamber to have a first high degree of vacuum;

a third means for pumping said load lock chamber to have a second high degree of vacuum, said third means being separated from said second means;

a fourth means for pumping said reaction chamber to maintain said first high degree of vacuum, said fourth means being separated from said second means and from said third means so as to prevent said reaction chamber and said load lock chamber from being incorporated into one chamber when a wafer passes into and out of said reaction chamber, said fourth pumping means preventing said first high degree of vacuum from being degraded by pumping said reaction chamber; and a plurality of valves for respectively opening and closing a plurality of vacuum lines interconnected to said reaction chamber and said load lock chamber according to operations of said first, said second, said third, and said fourth means.

2. A vacuum pumping system as claimed in claim 1, wherein each of said third means and said fourth means respectively comprise a mechanical pump and a turbo pump for pumping said load lock chamber and said reaction chamber to prevent air from flowing back into said reaction chamber, thereby maintaining said first high degree of vacuum in said reaction chamber.

3. A vacuum pumping system as claimed in claim 1, wherein said first means is a dry pump.

4. A vacuum pumping system as claimed in claim 1, wherein said second means is a cryo pump.

* * * * *